(12) United States Patent
Aliyev et al.

(10) Patent No.: US 8,174,032 B2
(45) Date of Patent: May 8, 2012

(54) SEMICONDUCTOR WHITE LIGHT SOURCES

(75) Inventors: Yevgueni Tofik Aliyev, Moscow (RU);
Petr Pavlovich Anikin, Odintsovo (RU);
Alexander Valerievich Shishov, Bykovo (RU); Alexander Olegovich Ustinov, Moscow (RU)

(73) Assignee: Light Engines Corporation, Moscow (RU)

( * ) Notice: Subject to any disclaimer, the term of this patent is extended or adjusted under 35 U.S.C. 154(b) by 0 days.

(21) Appl. No.: 11/377,774

(22) Filed: Mar. 16, 2006

(65) Prior Publication Data

US 2007/0221925 A1      Sep. 27, 2007

(51) Int. Cl.
*H01L 33/50* (2010.01)

(52) U.S. Cl. ............... 257/88; 257/98; 257/E33.061; 257/E33.068

(58) Field of Classification Search ............... 257/88, 257/98, E33.061, E33.068
See application file for complete search history.

(56) References Cited

U.S. PATENT DOCUMENTS

| | | | | |
|---|---|---|---|---|
| 5,813,752 A * | 9/1998 | Singer et al. | | 362/293 |
| 6,498,440 B2 * | 12/2002 | Stam et al. | | 315/291 |
| 6,799,865 B2 * | 10/2004 | Ellens et al. | | 362/240 |
| 6,858,869 B2 * | 2/2005 | Fujiwara | | 257/79 |
| 7,798,678 B2 * | 9/2010 | Destain | | 362/311.02 |
| 2004/0217364 A1 * | 11/2004 | Tarsa et al. | | 257/89 |
| 2005/0130336 A1 * | 6/2005 | Collins | | 438/26 |

OTHER PUBLICATIONS

Collins Dictionary of Astronomy. London: Collins, 2006. s.v. "lens," http://www.credoreference.com/entry/collinsastron/lens (accessed Aug. 12, 2010).*

* cited by examiner

*Primary Examiner* — Wensing Kuo
(74) *Attorney, Agent, or Firm* — The Webb Law Firm

(57) ABSTRACT

Semiconductor white light sources presented herein include special combinations of a blue source and a yellow source where these light fields are substantially overlapped. The source of blue light includes a blue emitting semiconductor operating in a conventional manner. However, this blue light source is combined with a special yellow light source and the light produced by each is mixed together. The yellow light source is primarily comprised of a high output ultraviolet emitting semiconductor coupled to a wavelength shifting medium whereby the semiconductor pumps the wavelength shifting medium causing re-emission at longer wavelengths; namely those corresponding to yellow colored light. These two sources operating in conjunction with each other operate to produce higher outputs than those attainable in competitive white light semiconductor systems. In special versions, provision is made whereby the color coordinates may be tuned by a variable current applied to the blue emitting semiconductor.

5 Claims, 9 Drawing Sheets

SEMICONDUCTOR WHITE LIGHT SOURCES

BACKGROUND OF THE INVENTIONS

1. Field

The following invention disclosure is generally concerned with semiconductor based light sources and specifically concerned with semiconductor based broadband light sources having high output flux.

2. Prior Art

Practitioners of the optical sciences will be quick to point out several techniques for simulating a white-light, light emitting diode LED. 'Simulate' is specified as the intrinsic properties of LEDs demand that they emit light in relatively narrow bands; white light is by definition, a broad optical spectral band. To date, there are no real 'broadband' LED emitters which truly produce white light at the diode junction in sufficient quantity and efficiency so as to be commercially viable. Rather, there are several configurations deployed to mix light from a plurality of narrow band individual sources.

For example, one might combine in close proximity red, green, and blue emitting diode chips. If the associated brightness of each is appropriate, and the system is viewed from sufficiently far away whereby the eye does not resolve the individual chips, it will appear to be a 'white' LED light source. Many difficulties are found in such systems and these are currently not in favor. They are problematic in manufacturing and their performance is not favorable.

In some systems, a single diode chip which produces ultraviolet light is combined with three different phosphors which emit light in various parts of the spectrum. The ultraviolet chip stimulates each of the phosphors and their emissions combine to form white light. These systems have yet to win favor for their lack of efficiency.

A very useful alternative which has recently become enabled via high brightness blue emitting diodes is realized in the following manner. A high brightness blue LED is placed on a substrate. A coating or slurry of phosphor is applied thereon the top of the semiconductor chip. This special phosphor is stimulated by blue light emitted by the chip. When stimulated, the phosphor emits light, albeit with less energy (longer wavelength) than the stimulating light. Phosphors which are stimulated by blue light and emit yellow light have been used to form 'White' LEDs. It is tricky to get the coating of phosphor just right. The interaction cross section dictates how much of the blue light is converted to yellow. As it is desirable to have just the right amount of blue light mix with just the right amount of yellow light, the thickness and density of the phosphor coating has a great effect on the interaction cross section. The nature of the phosphor grain also effects the interaction cross section and scattering properties. In particular, the size and shape of the phosphor particles changes the interaction characteristics. Because geometries particular to semiconductor chips and LED device packaging, commonly used techniques present problems in angular uniformity, among others.

For example, such configurations typically employ a blue emitting LED with a wavelength of about 455 nm and a yellow emitting phosphor such as cerium doped YAG, yttrium-aluminum-garnet, having its peak secondary emission at about 560 nm the half-width of the spectrum, that equals about 120 nm. This results in a color temperature of about 8000° K. and a low CRI of about 70.

U.S. Pat. No. 5,998,925 describes systems where a YAG based phosphor is used to convert blue light emitted from a nitride semiconductor into yellow light.

Shimizu presents similar invention in his U.S. Pat. No. 5,998,925, which we consider as an analogue. According to this patent, for semiconductor structures of InGaN, it is suggested using photophosphor out of alluminium-yttrium garnet in accordance with the formula:

$$Y_{3-x-y}Gd_xCe_3(Al,Ga)_5O_{12}.$$

Combining such photophosphor with light from a semiconductor, i.e. yellow light at approximately $\gamma=560$ nm, allows one to achieve a combined output radiation of a white nature or close to white color with various color tints (bluish, yellowish etc.) This construction became widely used in manufacturing, though it is not devoid of deficiencies including at least:

Relatively low color rendering, defined in the form of color index $R_a \leq 70$ units;

Insufficiently high optical emission output out of aluminum-yttrium garnet (photophosphor) due to a large difference in refraction indices of phosphor grains (n=1.95) and organic polymer (n=1.45) used as glue for fixing grains to emitting facets of a light-emitting diode;

High cost of phosphor conditioned by using expensive rare-earth metals such as yttrium, gadolinium, cerium at the phosphor synthesis.

All the mentioned deficiencies led to creating a new photophosphor for light-emitting diodes, the base of which are strontium orthosilicates with a general formula:

$$Sr_{2-x}Eu_xSiO_4.$$

Orthosilicate photophosphor emits in green or green-yellowish areas of visible spectrum (from $\gamma_{max}=520$ nm up to $\gamma_{max}=550$ nm) with half-width of radiation spectrum equal $\gamma_{0.5}=80$ nm±20 nm. It is expected that orthosilicate photophosphors will compete with standard aluminum-yttrium materials.

Particular attention is drawn to US patent application publication numbered 2004/0251809, which discloses a phosphor and light emitting device using same phosphor. In particular, a phosphor comprising a host material composed of a compound having a garnet crystal structure represented by the general formula:

$$M^1_aM^2_bM^3_cO_d$$

Wherein $M^1$ is a die feeling metal elements, $M^2$ is a trivalent metal element, $M^3$ is a tetravalent metal element containing at least Si, 'a' is between 2.7 to 3.3, 'b' is 1.8 to 2.2, and 'c' is between 2.7 and 3.3, and 'd' is a number 11.0-13.0. It is particularly important to note that this a material is based upon the garnet crystal structure. In addition, the absence of halogens is notable.

Inventors Tasch, et al teaching U.S. Pat. No. 6,809,347 issued Oct. 26, 2004 luminophore which comes from the group of alkaline earth orthosilicates and which absorbs a portion of light emitted by a light source and emits light in another spectral region. These alkaline earth orthosilicate photophosphors are activated with bivalent europium. To improve the broadband nature of these systems, additional luminophore selected from the group of alkaline earth aluminates activated with bivalent europium and/or manganese, and additional luminophore of a red-emitting type selected from the group Y(V,P, Si)O$_4$:Eu or can contain up claim earth magnesium disilicate.

Yet another white light system is presented by Taiwanese company Vtera Technology Inc. in U.S. Pat. No. 6,825,498. In this system a 'P'-type ZnTe layer or ZnSe layer is formed along with the LED. Blue light from the LED is absorbed by the ZnTe or ZnSe layer and converted in wavelength to a yellow green light. In this manner, a wavelength conversion layer is provided in conjunction with a typical blue emitting LED.

Inventors Ellen's et al, present in their disclosure, U.S. Pat. No. 6,759,804 issued Jul. 6, 2004 illumination devices with at least one LED as a light source. Wavelength conversion is achieved by way of a phosphor which originates from the class of (Eu, Mn)-coactivated halophosphates, where the cation and is one of the metals Sr, Ca, Ba.

The same inventors further teach in their U.S. Pat. No. 6,674,233 further inventions relating to illumination units having an LED as a light source. However these systems include phosphors from the class of cerium activated sialons, the sialon corresponding to the formula:

$$M_{p/2}Si_{12-p-q}Al_{p+q}O_qN_{16-q}:Ce^{3+}$$

U.S. Pat. No. 6,501,100 is entitled: "White light emitting phosphor blend for LED devices". There is provided a white light illumination system including a radiation source, a first luminescent material having a peak emission wavelength of about 570 to about 620 nm, and a second luminescent material having a peak emission wavelength of about 480 to about 500 nm, which is different from the first luminescent material. The LED may be a UV LED and the luminescent materials may be a blend of two phosphors. The first phosphor may be an orange emitting $Eu^{2+}$, $Mn^{2+}$ doped strontium pyrophosphate, $(Sr_{0.8}Eu_{0.1}Mn_{0.1})_2P_2O7$. The second phosphor may be a blue-green emitting $Eu^{2+}$ doped SAE, $(Sr_{0.90-0.99}Eu_{0.0-0.1})_4Al_{14}O_{25}$. A human observer perceives the combination of the orange and the blue-green phosphor emissions as white light.

In U.S. Pat. No. 6,577,073 an LED lamp includes blue and red LEDs and a phosphor. The blue LED produces an emission at a wavelength falling within a blue wavelength range. The red LED produces an emission at a wavelength falling within a red wavelength range. The phosphor is photoexcited by the emission of the blue LED to exhibit a luminescence having an emission spectrum in an intermediate wavelength range between the blue and red wavelength ranges.

U.S. Pat. No. 6,621,211 presents white light emitting phosphor blends for LED devices. There is provided white light illumination system including a radiation source, a first luminescent material having a peak emission wavelength of about 575 to about 620 nm, a second luminescent material having a peak emission wavelength of about 495 to about 550 nm, which is different from the first luminescent material and a third luminescent material having a peak emission wavelength of about 420 to about 480 nm, which is different from the first and second luminescent materials. The LED may be a UV LED and the luminescent materials may be a blend of three or four phosphors. The first phosphor may be an orange emitting $Eu^{2+}$, $M^+$ activated strontium pyrophosphate, $Sr_2P_2O_7:Eu^{2+}$, $Mn^{2+}$. The second phosphor may be a blue-green emitting $Eu^{2+}$ activated barium silicate, $(Ba,Sr,Ca)_2SiO_4:Eu^{2+}$. The third phosphor may be a blue emitting SECA phosphor, $(Sr,Ba,Ca)_5(PO_4)_3Cl:Eu^{2+}$. Optionally, the fourth phosphor may be a red emitting $Mn^{4+}$ activated magnesium fluorogermanate, $3.5 MgO\ 0.5\ MgF_2\ GeO_2:Mn^{4+}$. A human observer perceives the combination of the orange, blue-green, blue and/or red phosphor emissions as white light.

While systems and inventions of the art are designed to achieve particular goals and objectives, some of those being no less than remarkable, these inventions have limitations which prevent their use in new ways now possible. Inventions of the art are not used and cannot be used to realize the advantages and objectives of the inventions taught herefollowing.

SUMMARY OF THESE INVENTIONS

Comes now, Aliyev Y. T.; Anikin P. P.; Shishov A. V.; and Ustinov A. O., with inventions of semiconductor white light sources. It is a primary function of these systems to provide new high performance, high output optical sources characterized as semiconductor white light sources. It is a contrast to prior art methods and devices that present systems do not deploy the three-color multiple chip assemblies; nor does it rely upon a 'blue chip+phospho'; nor UV+3 phosphor combinations. A fundamental difference between semiconductor white light sources of these instant inventions and those of the art can be found when considering its hybrid nature including the combination of multiple semiconductor chips in a single device, and high performance nature of the blue/yellow spectral combinations.

These systems achieve broadband output by combining light from two sources into a single illumination field. Blue light from a first source is combined with yellow light from a second source—the resulting illumination field is a broadband optical spectrum which appears 'white' to a human observers. The first source produces blue light from a special diode arrangement of for example InGaN structures. Current passed through the device causes light emission as electrons are pushed through an energy 'band gap' at a semiconductor material junction. Such blue emitting semiconductors have recently been greatly improved and their efficiency and cost are favorable for mass production. The second source produces yellow light from a combination of two subsystems. A yellow source is formed from a high output ultraviolet emitting semiconductor device coupled to a wavelength shifting medium which converts the high energy, short wavelength of UV into longer wave yellow light by way of an absorption/re-emission mechanism. Such wavelength shifting media may be a phosphor crystalline material having excitation spectra well coupled to the output spectra of a specially designed diode. As such, this high performance phosphor/diode combination is very efficient at converting UV light into yellow light and thus contributes to an overall system having exceptionally high output.

Accordingly, these inventions include semiconductor based 'white' light or broadband sources formed from two primary subsystems including: a) a blue emitting semiconductor and b) an ultraviolet emitting semiconductor in combination with a yellow emitting phosphor. So called 'double chip' systems of these inventions include semiconductor chips which may be electrically driven independently, the semiconductors are coupled to a common lens which provides spatial mixing such that light produced by the chips is mixed into a common light field. In the light field of the device output, blue light and yellow light together is perceived as 'white light'.

In some versions, a special 'dispersant' agent is additionally provided to interact with the emission of one of the optical sources, the blue emitting semiconductor, to impart a preferred beam spread characteristic. Unique arrangements of this element with regard to its coupling with the blue chip are important aspects of these teachings.

In other special versions, the blue source is made tunable with regard to its output intensity to permit adjustments to the color coordinates. Electrical current in the blue chip may be independent and varied with regard to the current in the UV chip. In this way, the precise nature (color) of the output becomes tunable.

In other versions, special unexpected structures are made possible via a remarkable property of one semiconductor source with respect to its cooperation with the other semiconductor source. That is, the UV emitting semiconductor is transparent to blue light emitting from the other source and thus one of these devices may lie in the optical path of the other without adversely disturbing its output. A highly unusual vertical stack of light emitting semiconductor elements is arranged to form a compound unit and promote special beam mixing advantages. A blue emitting chip is disposed under or 'before' an ultraviolet emitting chip with respect to the optical path. Output of the blue emitting semiconductor passes through the ultraviolet emitting semiconductor undisturbed. In this way, the separate light sources share a common optic axis thus improving beam shape and cooperation with a single lens as both sources may be "on-axes".

OBJECTIVES OF THESE INVENTIONS

It is a primary object of these inventions to provide new high performance white light sources.

It is an object of these inventions to provide semiconductor light sources with high intensity broadband output.

It is a further object to provide combinations of two opto-mechanical systems to yield highly efficient white light output.

It is an object of these inventions to provide white light sources with tunable color coordinates.

It is an object of these inventions to provide white light source with improved angular light distribution.

Better understanding can be had with reference to detailed description of preferred embodiments and reference to appended drawings. Embodiments presented are particular ways of realizing these inventions and are not inclusive of all ways which might be possible. Therefore, there may exist embodiments which do not deviate from the spirit and scope of this disclosure as set forth by appended claims, but do not appear here as specific examples. It should be appreciated that a great plurality of alternative versions are possible.

BRIEF DESCRIPTION OF THE DRAWING FIGURES

These and other features, aspects, and advantages of the present invention will become better understood with regard to the following description, appended claims and drawings where:

GLOSSARY OF SPECIAL TERMS

Figure 1:
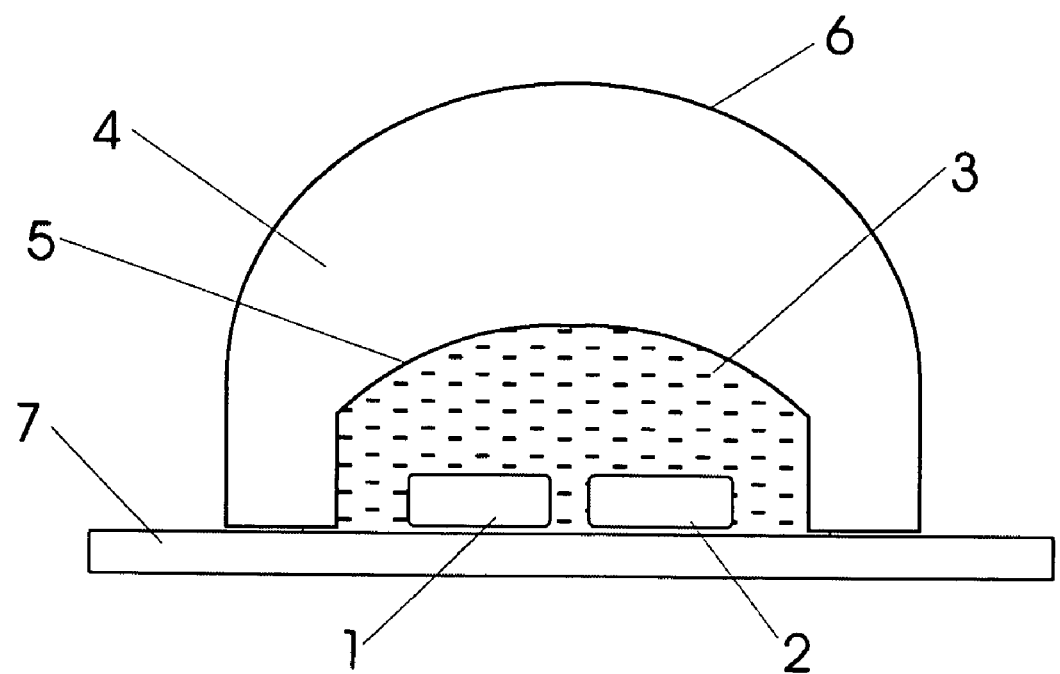
FIG. 1 illustrates a simplest version of these optical systems in a cross section diagram.

Throughout this disclosure, reference is made to some terms which may or may not be exactly defined in popular dictionaries as they are defined here. To provide a more precise disclosure, the following terms are presented with a view to clarity so that the true breadth and scope may be more readily appreciated. Although every attempt is made to be precise and thorough, it is a necessary condition that not all meanings associated with each term can be completely set forth. Accordingly, each term is intended to also include its common meaning which may be derived from general usage within the pertinent arts or by dictionary meaning. Where the presented definition is in conflict with a dictionary or arts definition, one must consider context of use and provide liberal discretion to arrive at an intended meaning. One will be well advised to error on the side of attaching broader meanings to terms used in order to fully appreciate the entire depth of the teaching and to understand all intended variations.

Wavelength Shifting Medium

Wavelength shifting medium includes a phosphor or other crystalline or granular matter which absorbs light at high energy (short) wavelengths and re-emits light at a lower energy (longer) wavelengths. A wavelength shifting medium may also include a binder material to hold phosphor particles in a spatially distributed suspension or colloid.

Dispersant Medium

Dispersant is crystalline or granular matter which interrupts the optical path of light falling incident thereon via reflection, refraction or diffraction but is otherwise highly inert or non-absorbent. A dispersant medium may also include a binder material to hold phosphor particles in a spatially distributed suspension or colloid.

Binder

Binder' is a material such as a gel, epoxy resin, polyurethane, et cetera used a binding agent operable for holding in suspension therein another material comprised of small grains or crystals such as phosphor or dispersants.

Blue Transparent

Blue transparent is meant to indicate a material having an optical pass band which corresponds to the blue portion of the optical spectrum.

Envelope

Envelope' is a term used to mean 'to surround' and 'to cover'.

PREFERRED EMBODIMENTS OF THESE INVENTIONS

In accordance with each of preferred embodiments of these inventions, semiconductor based white light sources are provided. It will be appreciated that each of embodiments described include an apparatus and that the apparatus of one preferred embodiment may be different than an apparatus of another embodiment.

Systems first presented here are primarily characterized as white light sources based upon semiconductor light emitting diodes. Two high energy chips are combined in a special fashion to realized a broadband or 'white' light output. The two chips are combined together with a single package including a lens system. Further, at least one chip is coupled with a wavelength shifting medium such that light emitted by the diode is converted to longer wavelengths. An ultraviolet emitting chip pumps a phosphor causing it to re-emit light in the yellow region of the visible spectrum. In this way, a very bright yellow source is attainable. This yellow source is combined with a very bright blue source to present a white light output. In competing systems, a portion of the blue light is converted to yellow light so the total blue output is far lower than what is possible here.

One primary key to these systems is the special phosphors used. These phosphors are highly active with respect to ultraviolet light and as such their conversion efficiency is excellent when pumped with ultraviolet light. Furthermore, there emission spectrum is perfect for white light systems; that is, they emit light in the yellow spectral band. Because of their excellent pump coupling and preferred emission characteristics, these phosphors are ideal.

Another aspect which makes these systems valuable, the two optical bands may be adjusted in intensity to effect color changes. The blue chip can be electrically driven independently from the UV chip to increase/decrease blue intensity thus adjusting the coldness/warmness of the source dynamically.

Due to the fact that a UV emitting semiconductor can be transparent to blue light, these chips may be stacked vertically so as to share a single optic axis for preferred coupling to a lens having a single optic axis. In this way, these systems can have an output field of 'overlapped' optical energy from the two sources which may be appear very near to the same focal point of the lens. Where the lens is arranged with strong chromatic aberration, the color dependant foci may be made to be nearly located in a single point thus further improving the overlap possible.

In some versions, it is desirable to discriminate with respect to a dispersant function being applied to one but not both semiconductor chips. Accordingly, these inventions include versions where a dispersant is applied to the blue chip but not to the UV chip. Both in the side-by-side arrangement and the 'stacked' vertical arrangement, a dispersant may be applied whereby its effect is only applied to the blue output to the exclusion of the UV/yellow output.

These concepts and other are more readily appreciated as they are disclosed in great enabling detail in the discussion following with reference to the appended drawing figures and reference numerals therein.

FIG. 1 illustrates an important general and foundation version of these inventions. A first semiconductor chip 1, is an ultraviolet emitting chip. In preferred versions, an InGaN semiconductor is arranged as a diode. Electrical current is applied to this are such that electrons are through an energy and you thus causing emission of a photon of high-energy corresponding to light in the ultraviolet spectrum.

A second semiconductor chip 2, is a blue emitting device, also preferably formed of an InGaN structure. Photons emitted in response to electrical current passing there through our of wavelengths associated with the blue portion of the optical spectrum. These wavelengths are between about 420 and 480 nm, with best versions at about 455 nm.

A wavelength shifting medium 3, is disposed on, near and about a these semiconductor devices as shown in the drawing. Wavelength shifting medium, they be comprised of phosphor out or in small grains held in a suspension or colloid form. A transparent material such as in polymer is soft, pliable and transparent. In addition, it has a high thermal conduction are which aids in heat removal. Phosphor grains may be formed in processes to achieve a desired uniformity and size. Such phosphor grain may be mixed with the binder to uniformly distribute the phosphor at a desired concentration which permits the greatest conversion efficiency. A phosphor is designed to absorb ultraviolet light into reemit light and longer wavelengths, namely at yellow wavelengths of between about 540 and 580 nm. Phosphors having high efficient excitation spectra in the ultraviolet spectral region and emission in the yellow region can be highly efficient. Further, InGaN semiconductor diode can have very high energy outputs.

For wavelength shifting material to function properly, it must merely be illuminated via ultraviolet light. Thus, placing wavelength shifting medium in proximity to the semiconductor, i.e. in the emission field, is sufficient to cause it to produce yellow light. It is noteworthy to point out that while light from the other semiconductor (blue) will also 'pump' the medium, it does so to a far lesser extent. In essence, the wavelength shifting medium is mostly transparent with respect to blue light.

To provide a container for the wavelength shifting medium, a lens 4 may be formed of a hard plastic optical grade material. It is underside surface 5 partly forms a cavity which may be filled with the wavelength shifting material. The top surface of the lens, may be shaped to impart an optical advantage, i.e. to concentrate, columnize, or to otherwise focus light fields emitted from the semiconductors.

When the lens is a pushed to and coupled with a substrate 7, the lens/substrate combination forms an enclosed cavity which operates to contain both semiconductor chips and the wavelength shifting medium. That this material is closely coupled and surrounds the blue semiconductor has little or no adverse effect on its performance or output.

Another important structural consideration is that both ultraviolet and blue semiconductor chips are arranged to have outputs which emit light into a common illumination field. While the figures appended hereto are drawn with a view to clarity; they are not drawn to scale. For emphasis, the scale of FIG. 2 more closely reflects the actual design and is presented to better illustrate the common illumination field which is shared by the two semiconductors by way of the lens coupled to the pair. Semiconductors 21, are actually quite small and mounted on the substrate 22 as shown. Lens 23 has an undersurface 24 which forms a cavity and further has an optical surface 25 to effect focusing of rays which pass through the surface. The lens symmetry defines an optic axis 26. The device is completed by a addition of wavelength shifting medium 27 which fills the enclosed space between the lens and the substrate. The device produces white light; i.e. the presence of blue light from the blue emitting semiconductor and yellow light from the combination of the ultraviolet emitting semiconductor and wavelength shifting medium in a common illumination field.

Figure 2:
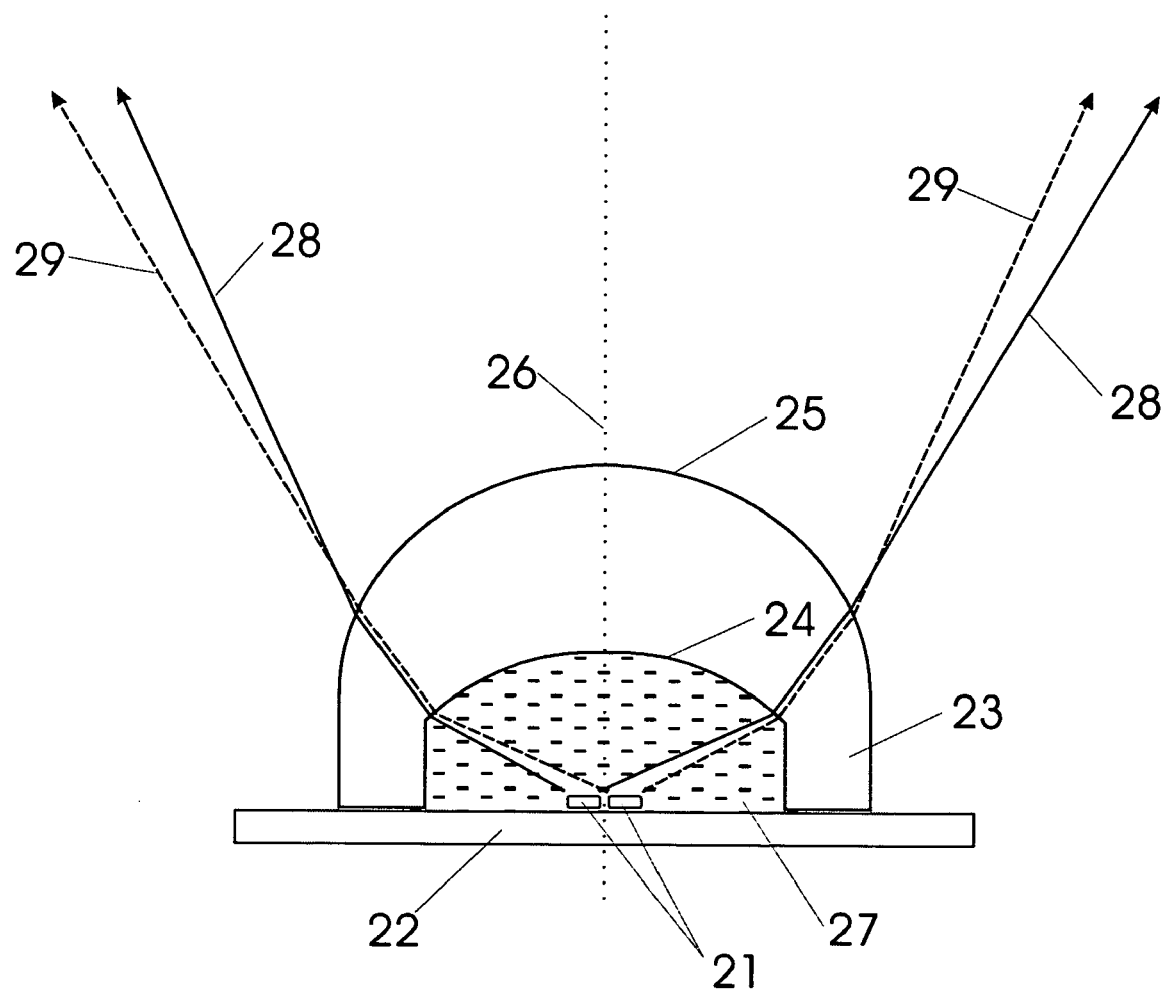
FIG. 2 shows these systems in conjunction with a ray trace diagram showing illumination field overlap.

Careful observers will note is that the construction of FIG. 2 includes an arrangement where each semiconductor is slightly displaced from the optic axis of the lens. This has the end result of causing a slight angular difference between the beams produced by each semiconductor. A first semiconductor produces a first beam 28 while second semiconductor produces a second beam 29; these two beams leave the device slightly different angles. When careful design, this can be minimized and the great majority of the light from both emitters falls into a common illumination field. Except at the extremities of the beam, light in the common field will appear white to viewers.

Figure 3:
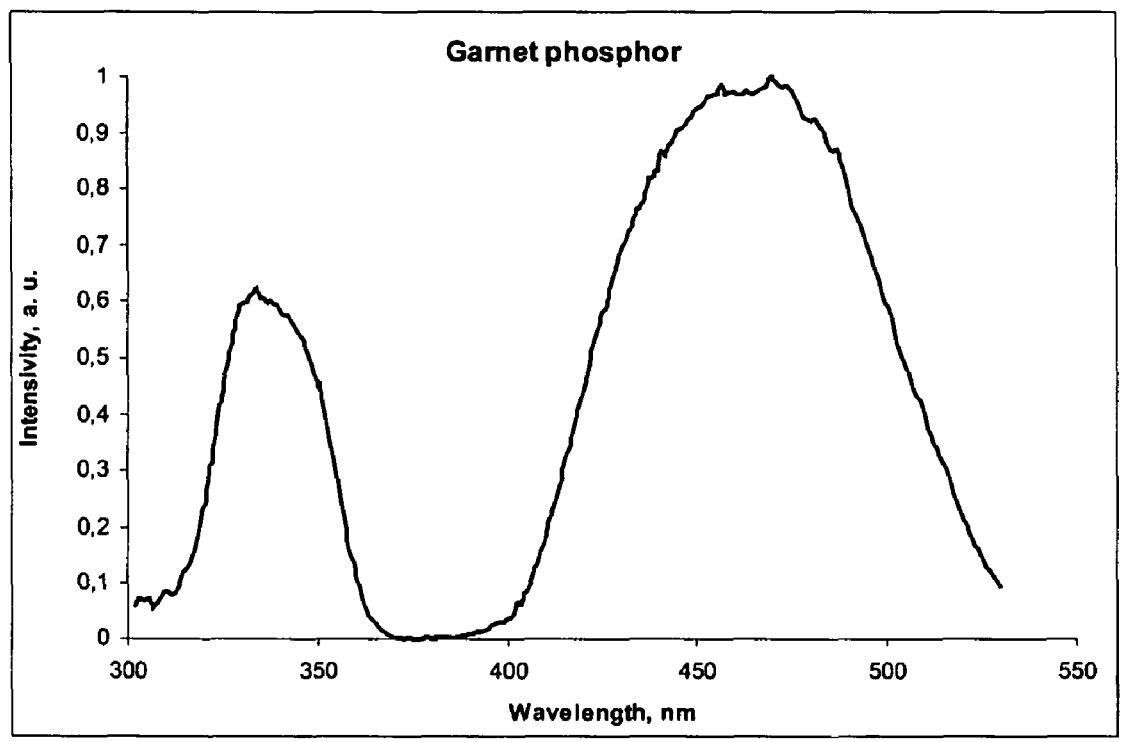
FIG. 3 is an intensity plot of the excitation spectrum of a wavelength shifting medium—a YAG phosphor.

FIG. 3 is an example of an excitation spectrum of a YAG type phosphor. The phosphor can "be pumped" by blue photons. While YAG phosphors are very good for producing yellow light, their pump mechanism is not as responsive to the high-energy ultraviolet photons as it is to the lower energy blue photons. Accordingly, the leading candidate for white light sources remains blue LEDs in combination with the YAG phosphors. This is disadvantageous for two reasons. In those the systems, both the blue light and yellow light are generated from a single junction having a maximum current limit and heating damage threshold. A single chip has a limited ability to produce photons and that limit is presently being met by all state-of-the-art, high-performance semiconductor white light sources.

Figure 4:
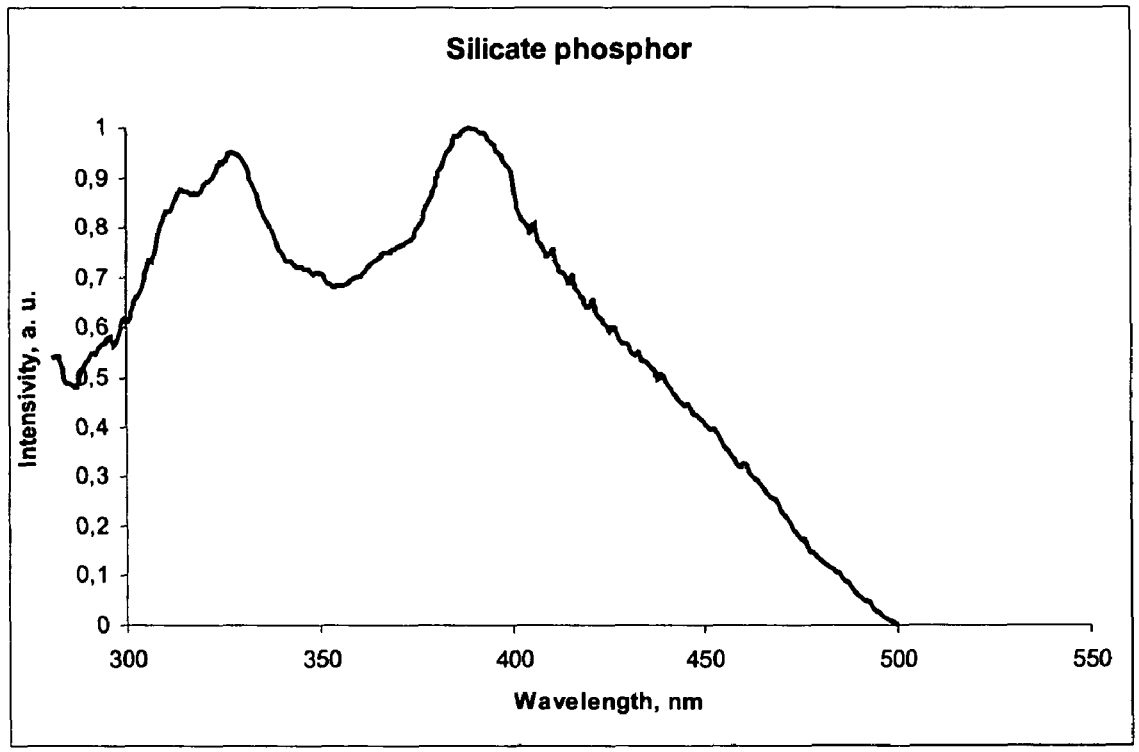
FIG. 4 is an intensity plot of the excitation spectrum a wavelength shifting medium—a silicate phosphor.

Silicate and Theogalate phosphors offer a higher pump response in the ultraviolet spectral region. These phosphors may also have an output including yellow light. The plot of FIG. 4 illustrates the excitation spectrum of a choice silicate phosphor. While the conversion efficiency of this system is quite good, the output is comprised of ultraviolet and yellow light which, while broadband, does not effect a desired white light output as the necessary blue light is absent. It is known that efficacy of the Silicate phosphors under the blue excitation is on approximately 10-20% lower than for YAG but efficacy of the Silicate phosphors under the UV excitation is much higher than efficacy of the YAG under the blue light excitation (>1.5). Due to that fact we can obtain higher flux of the yellow light for the Silicate phosphors. Higher efficacy of Silicate (Theogalate) phosphors under the UV excitation provides opportunity to use lower concentration of phosphors in the white LEDs that provides essential economy of the phosphors in the case of mass production. At the same time the lower refraction index for Silicate phosphor 1.6 (in comparison with 1.9 for YAG) will provide better optical matching with binder material and increase a light output from the phosphor grains.

Figure 5:
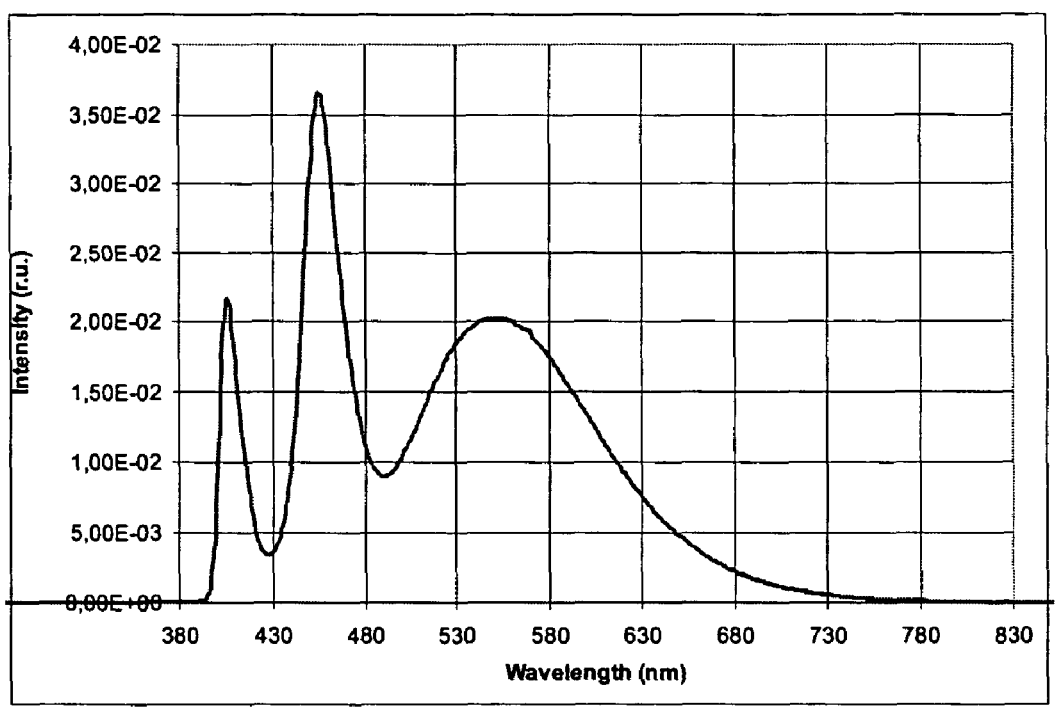
FIG. 5 is an intensity plot of a compound system comprising spectral peaks at 455 (blue) and 555 (yellow)

To achieve a excellent white light output, it is necessary to combine a blue source with a highly efficient silicate/ultraviolet system. Thus, a highly effective 'double chip' device is comprised of a blue emitting semiconductor in combination with a yellow source formed from an ultraviolet emitting semiconductor and silicate (or alternative) phosphor. When the output is mixed in the same space, i.e. these light sources are put under a lens such that their outputs are emitted into a common space, then the result is a very high intensity white light or 'broadband' optical output. FIG. 5 is an intensity plot of the output spectrum of one of such systems. The ultraviolet/phosphor combination produces a strong intensity peak at approximately 560 nm and the blue emitting semiconductor produces intensity peak at about 455 nm. Some energy is lost to an ultraviolet intensity peak which does not contribute to usable white output.

Figure 6:
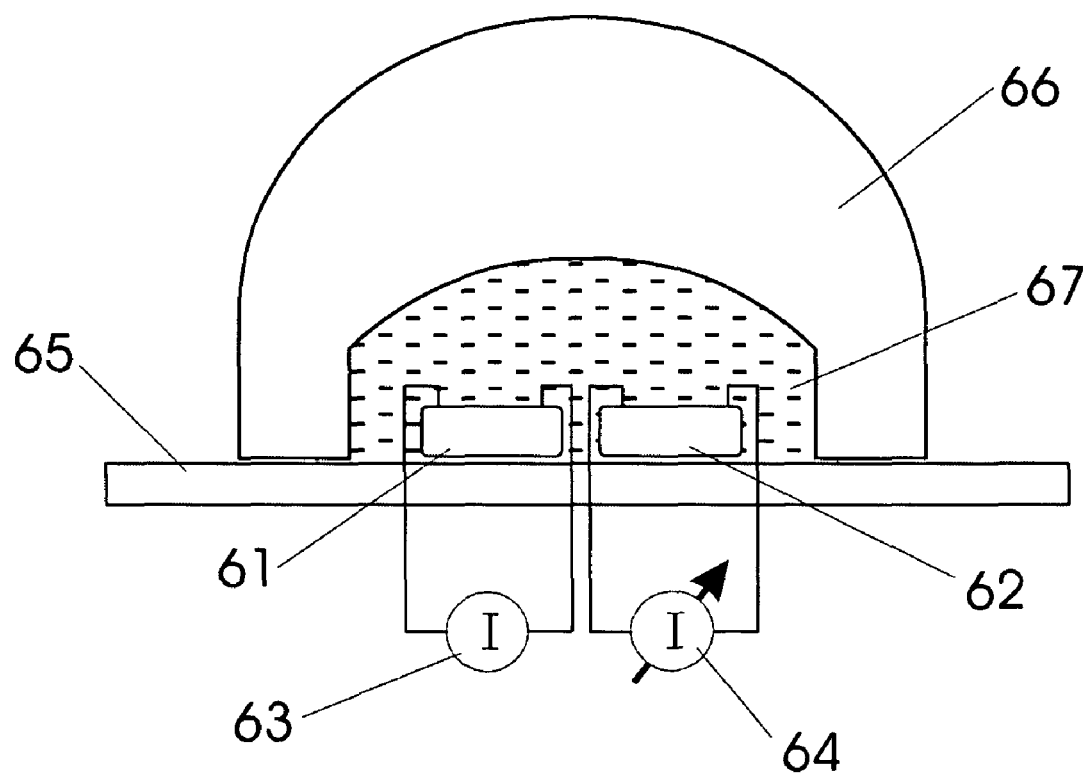
FIG. 6 is a diagram including separate electrical drive inputs for two semiconductors.

Since the system is comprised of two independent chips, they may be driven independently such that the output of each is adjustable. Thus, the intensity of the blue output can be increased or decreased in relation to the yellow output. FIG. 6 illustrates. A device is comprised of an ultraviolet emitting semiconductor 61 and a blue emitting semiconductor 62. A current source 63 may be applied to the ultraviolet chip to energize it causing an optical output proportional to the applied current. Another current source 64, may be applied to the blue emitting semiconductor to similarly drive that device thus producing blue light in proportion to that applied current. Substrate 65 and lens 66 together form an enclosed cavity which may be filled with a wavelength shifting medium 67 comprising binder material and phosphor. By adjusting the current applied to the blue emitting semiconductor, one may alter the intensity of the blue part of the output to effect a change in color coordinates.

Figure 7:
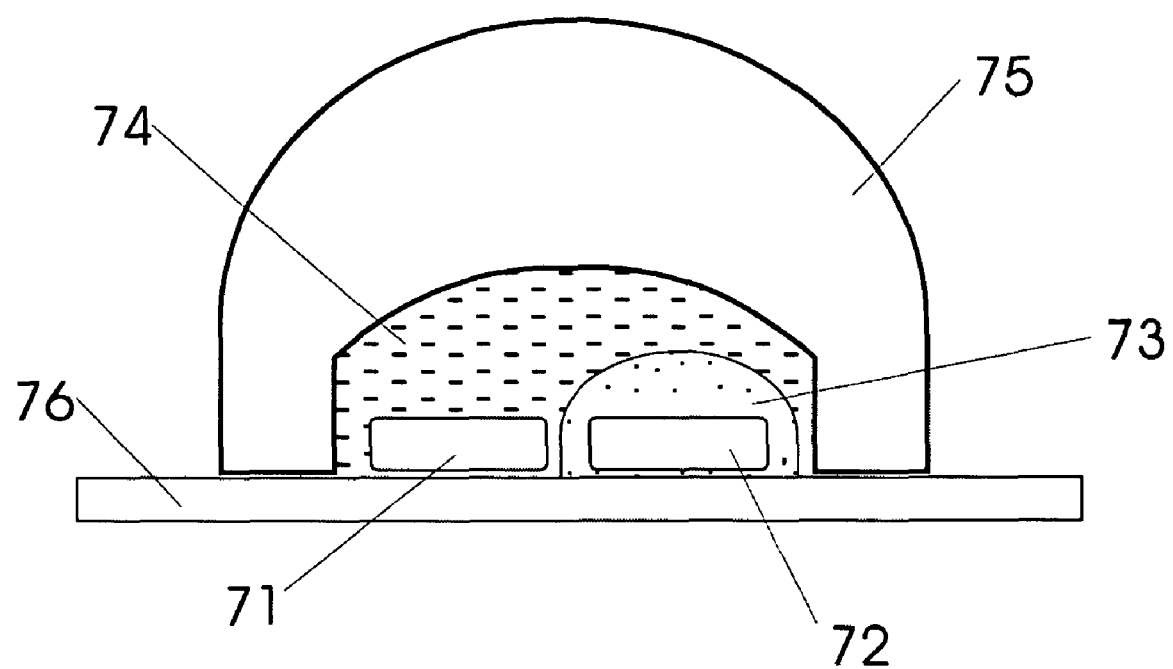
FIG. 7 is a special version with modification to the output of one of the semiconductor elements.

FIG. 7 is directed to another aspect of some important versions of these inventions. It sometimes becomes desirable to manipulate or control angular light distribution produced by one source to the exclusion of the other. Accordingly, various media may be applied to one or the other chip without having a material effect on the other. In one example, it is desirable to cause the blue beam to have a better angular distribution than that which comes naturally from the chip emission properties. A special dispersant medium may be applied about the blue emitting chip. An envelope of dispersant medium operates to more evenly distribute and spread a blue beam such that it more closely resembles beam produced by the ultraviolet/phosphor combination.

Accordingly, ultraviolet emitting semiconductor 71 placed aside and next to blue emitting semiconductor 72 forms a basis for an advanced white light optical source. A dispersant medium 73 is placed around the blue chip such that light emitted therefrom is exposed to the optical effects of the dispersant(s). These effects may include reflection, refraction, and diffraction. Forming an envelope about both chips, and additionally the dispersant material, is wavelength shifting material 74. This combination of semiconductor chips, dispersant material, and wavelength shifting material, are all formed, assembled and contained in a cavity is produced when a lens 75 is coupled to a substrate 76. Light emitted by the blue chip is subject first to the dispersant material then further to the wavelength shifting medium. Each of these media has its effect on the light as it passes therethrough. Light emitted by the ultraviolet semiconductor chip passes through the wavelength shifting medium, but not substantially through dispersant medium. In this way, the effect of either medium are selectively applied to either a emitter.

Figure 8:
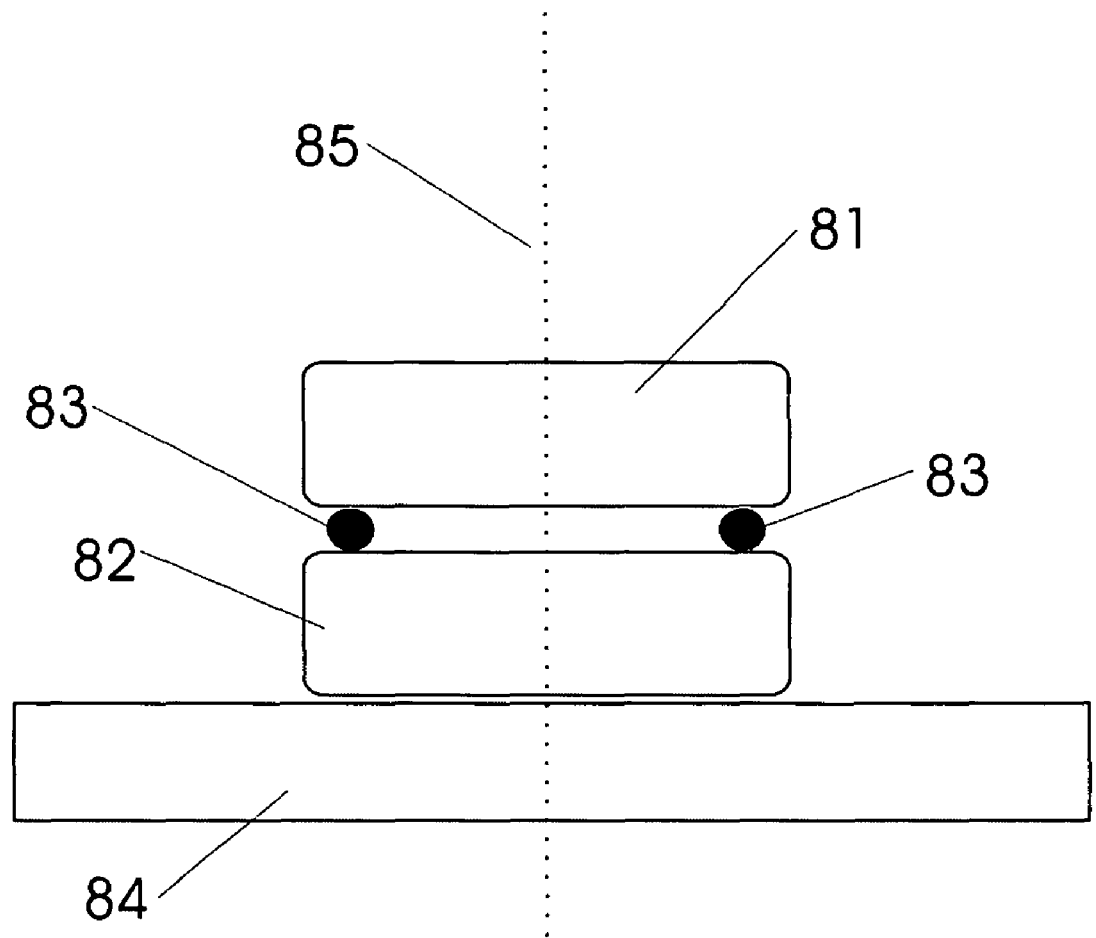
FIG. 8 shows a special version where semiconductor elements are stacked into a vertical column.
Figure 9:
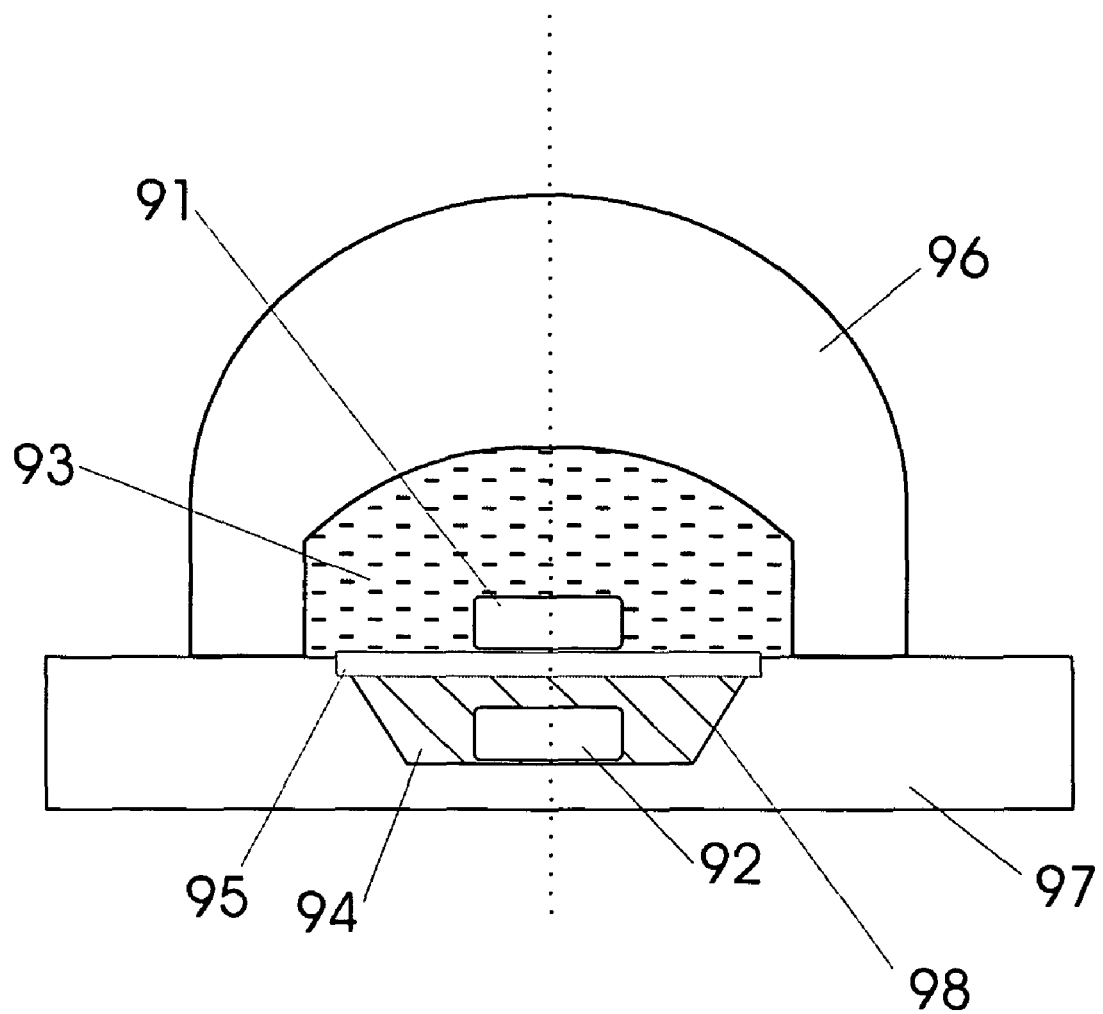
FIG. 9 is another version having semiconductors in a vertical column with further system support elements.

Other highly important versions of these inventions include those having both emitters with a common optic axis. That is, the emitters may be stacked one on top of the other. This is generally not possible due to the interference of one with respect to do beam emitted by the other. However, since the ultraviolet semiconductor chip is blue transparent, it may be placed in the optical path of the blue beam without having material adverse effect thereon. Light emitted by the blue chip passes through the ultraviolet chip and contributes normally to a common illumination field. Such arrangements are depicted pictorially in FIG. 8 which shows an ultraviolet emitting semiconductor chip 81, above and in close proximity to blue emitting semiconductor chip 82. These chips may be separated/coupled via electrical connectors or contacts 83. In alternative versions, these two chips may be separated by standoff elements rather than electrical contacts and conventional wire bonds may be used for electrical connections. The vertical stack of chips may be affixed to a mounting substrate 94 as shown. It is important to appreciate that both chips have the same optic axis 85 in contrast to those systems presented prior in this disclosure. In these special systems, it remains possible to couple the emitter chips to various media selectively. FIG. 9 illustrates one preferred version where the beam from the blue chip is subject to the disbursing action of a dispersant medium. Ultraviolet emitting chip 91 is mounted above blue emitting semiconductor chip 92 such that chips have a common optic axis. A wavelength shifting medium 93 envelopes the ultraviolet chip and dispersant medium 94 envelopes the blue chip. A special transparent separation substrate 95 may be added to improve the mechanical stability of the arrangement. In the manner set forth previously, lens 96 and substrate 97 operate together to form a containment cavity for these elements. In some preferred versions, the substrate includes a recess 98 in the shape of a conic section for example to provide a reflection for light which exits the sides of the blue chip thus coupling more blue light into the output beam.

Accordingly, these systems are best characterized in general as semiconductor white light sources having a blue emitting chip and an ultraviolet emitting chip in combination with a wavelength shifting medium. The wavelength shifting medium is placed close to the ultraviolet chip such that it is illuminated with ultraviolet light. The blue and ultraviolet chip are arranged to emit light into a common field where mixing occurs. The chips are, for example, InGaN diode structures which emit high energy light with an emission peak about 400 nanometers, and 460 nanometers. The wavelength shifting medium has an emission peak at about 560 nanometers.

The wavelength shifting medium is arranged as a colloid of phosphor grain suspended in a gel polymer binder material; sometimes either silicates or theogalates. The chips may be closely spaced, side-by-side on a substrate so that each of their primary emission surfaces is parallel to a mounting surface of the substrate to which they are fastened so that their emission fields form an overlapped output.

The chips are mounted together under a single lens which forms an enclosed cavity in conjunction with the substrate, the cavity may be filled with wavelength shifting media.

In some special versions, the blue chip can be surrounded in a dispersant material to result in a preferred angular light distribution. Like the wavelength shifting material, the dispersant material may also be a colloid of grains in a binder material.

In some versions, the chips may be mounted together in-line about a single optic axis; and sometimes having electrical contacts coupling therebetween; the contacts providing mechanical support.

In addition, the device may include a reflector element formed into a recess of a substrate; intermediate substrate transparent to blue light. This recess is arranged to reflect light upwardly into a beam along the direction of the optic axis.

In all versions, it is possible to drive the chips with different currents to selectively control the intensity of blue or yellow light and thus control the color coordinates.

One will now fully appreciate how advanced, high output, semiconductor based white light sources are realized. Although these present inventions have been described in considerable detail with clear and concise language and with reference to certain preferred versions thereof including best modes anticipated by the inventors, other versions are possible. Therefore, the spirit and scope of the invention should not be limited by the description of the preferred versions contained therein, but rather by the claims appended hereto.

We claim:
1. A semiconductor white light source comprising:
a blue emitting semiconductor;
an ultraviolet emitting semiconductor; and
a wavelength shifting medium, wherein:
said wavelength shifting medium is proximately disposed about said ultraviolet emitting semiconductor whereby it is illuminated with ultraviolet light output by said ultraviolet emitting semiconductor,
said blue emitting semiconductor and said ultraviolet emitting semiconductor are arranged to emit light into a common illumination field,
said semiconductors lie under an optical lens having a cavity in an underside, said cavity at least partly filled with said wavelength shifting medium, and
said ultraviolet emitting semiconductor has a primary emission surface parallel to a primary emission surface of said blue emitting semiconductor, mounted together each symmetric about a single optic axis.

2. The semiconductor white light source of claim 1, further including electrical contact coupling between said ultraviolet emitting semiconductor and said blue emitting semiconductor and operative for carrying electrical current for energizing said semiconductors and for providing mechanical support of the ultraviolet emitting semiconductor.

3. The semiconductor white light source of claim 1, further comprising a dispersant medium, said wavelength shifting medium enveloping said ultraviolet emitting semiconductor and said dispersant medium enveloping said blue emitting semiconductor.

4. The semiconductor white light source of claim 3, further comprising:
a reflector element formed into a recess of a substrate; and
a blue transparent intermediate substrate,
said reflector element optically coupled to said blue emitting semiconductor, and
said blue transparent intermediate substrate is disposed between said ultraviolet emitting semiconductor and said blue emitting semiconductor having thereon opposing sides said wavelength shifting medium and said dispersant medium.

5. The semiconductor white light source of claim 1, wherein said blue emitting semiconductor further comprising coupling to a variable current source.

* * * * *